US009243948B2

(12) United States Patent
Blodt

(10) Patent No.: US 9,243,948 B2
(45) Date of Patent: Jan. 26, 2016

(54) APPARATUS FOR DETERMINING OR MONITORING THE FILL LEVEL OF A SUBSTANCE IN A CONTAINER

(75) Inventor: Thomas Blodt, Basel (CH)

(73) Assignee: Endress + Hauser GmbH + Co. KG, Maulburg (DE)

( * ) Notice: Subject to any disclaimer, the term of this patent is extended or adjusted under 35 U.S.C. 154(b) by 212 days.

(21) Appl. No.: 14/126,561

(22) PCT Filed: May 21, 2012

(86) PCT No.: PCT/EP2012/059356
§ 371 (c)(1),
(2), (4) Date: Dec. 16, 2013

(87) PCT Pub. No.: WO2012/175257
PCT Pub. Date: Dec. 27, 2012

(65) Prior Publication Data
US 2014/0109666 A1  Apr. 24, 2014

(30) Foreign Application Priority Data

Jun. 24, 2011  (DE) .......................... 10 2011 078 060

(51) Int. Cl.
*G01F 23/284* (2006.01)
*G01F 23/296* (2006.01)
(Continued)

(52) U.S. Cl.
CPC .......... *G01F 23/284* (2013.01); *G01F 23/2962* (2013.01); *H03B 5/1203* (2013.01); *H03B 5/1228* (2013.01); *H03B 5/1243* (2013.01); *H03B 5/1852* (2013.01); *H03B 2200/0006* (2013.01)

(58) Field of Classification Search
None
See application file for complete search history.

(56) References Cited

U.S. PATENT DOCUMENTS 4,596,966 A   6/1986   Derewonko et al.
4,670,722 A   6/1987   Rauscher
(Continued)

FOREIGN PATENT DOCUMENTS

DE         10392903 T5     8/2005
DE      102006009467 A1    9/2007
(Continued)

OTHER PUBLICATIONS

Mar. 6, 2012 German Search Report, German Patent Office, Munich, Germany.
(Continued)

*Primary Examiner* — Andre Allen
(74) *Attorney, Agent, or Firm* — Bacon & Thomas, PLLC

(57) ABSTRACT

An apparatus for determining or monitoring the fill level of a substance in a container, including a high frequency oscillator, an in/out coupling unit, an antenna, which transmits measuring signals, which are coupled in via the in/out coupling unit, in the direction of the surface of the fill substance, respectively receives the measuring signals reflected on the surface of the fill substance, and an evaluating circuit, to which the measuring signals reflected on the surface of the fill substance are supplied and which ascertains the fill level in the container via a travel-time difference method. The high frequency oscillator includes a transistor with a source branch, a drain branch and a gate branch, at least one frequency tuning component and at least one frequency determining component. The frequency determining component of the high frequency oscillator is arranged in the source branch of the transistor.

10 Claims, 3 Drawing Sheets

(51) Int. Cl.
*H03B 5/18* (2006.01)
*H03B 5/12* (2006.01)

(56) References Cited

U.S. PATENT DOCUMENTS

| | | | |
|---|---|---|---|
| 4,868,526 A | 9/1989 | Camiade et al. | |
| 5,609,059 A * | 3/1997 | McEwan | G01F 23/284 342/124 |
| 6,466,099 B2 | 10/2002 | Festag | |
| 7,053,630 B2 | 5/2006 | Westerling et al. | |
| 8,031,018 B2 | 10/2011 | Kahmen | |
| 8,085,187 B2 | 12/2011 | Gard | |
| 2005/0017896 A1* | 1/2005 | Klofer | G01F 23/284 342/124 |
| 2009/0212997 A1* | 8/2009 | Michalski | G01F 23/284 342/137 |
| 2010/0103024 A1* | 4/2010 | Schultheiss | G01F 23/284 342/124 |
| 2012/0056628 A1* | 3/2012 | Michalski | G01F 23/284 324/629 |
| 2013/0036816 A1* | 2/2013 | Urban | G01F 23/296 73/32 A |
| 2013/0250460 A1* | 9/2013 | Grozinger | G01F 15/06 361/54 |
| 2014/0352402 A1* | 12/2014 | Hoch | G01F 23/265 73/1.73 |
| 2015/0082881 A1* | 3/2015 | Blodt | G01F 23/284 73/290 V |

FOREIGN PATENT DOCUMENTS

| | | |
|---|---|---|
| EP | 0321329 A1 | 6/1989 |
| EP | 1223667 A2 | 7/2002 |
| EP | 2211152 A2 | 7/2010 |
| WO | 2009138817 A1 | 11/2009 |

OTHER PUBLICATIONS

Oct. 31, 2012 International Search Report, EPO, The Netherlands.

* cited by examiner

APPARATUS FOR DETERMINING OR MONITORING THE FILL LEVEL OF A SUBSTANCE IN A CONTAINER

TECHNICAL FIELD

The invention relates to a fill-level measuring device, respectively an apparatus for determining or monitoring the fill level of a substance in a container, and includes a high frequency oscillator producing high-frequency measuring signals, an in/out coupling unit, an antenna, which transmits the high-frequency measuring signals in the direction of the surface of the fill substance and receives the measuring signals reflected on the surface of the fill substance, and an evaluating circuit, which, based on the travel-time difference of the transmitted measuring signals and the reflected high-frequency measuring signals, ascertains the fill level in the container. Furthermore, the invention relates to a high frequency oscillator, which is applicable especially in the case of an apparatus for determining or monitoring the fill level of a substance in a container.

BACKGROUND DISCUSSION

Known fill level measuring devices determine the fill level according to a travel-time difference method. Travel-time difference methods utilize the physical law, according to which the travel distance equals the product of travel time and propagation velocity. In the case of fill level measurement, the traveled distance corresponds to twice the separation between the antenna and the surface of the fill substance. The wanted echo signal, thus the measurement signal reflected on the surface of the fill substance, and its travel time are determined based on the so-called echo curve, respectively the digitized envelope curve, wherein the envelope curve shows the amplitudes of the echo signals as a function of the separation, 'antenna—surface of the fill substance'. The fill level itself results then from the difference between the known separation of the antenna from the floor of the container and the separation of the surface of the fill substance from the antenna, as determined by the measuring. Fill level measuring devices are applied in containers with heights of up to 30 m.

All known methods can be applied, which enable relatively short distances to be determined by means of reflected measuring signals. If the measurement signals are microwaves, respectively high-frequency measuring signals, then both pulse radar as well as also frequency modulation, continuous wave radar (FMCW-radar) can be used. Microwave measuring devices, which use pulse radar, are manufactured and sold by Endress+Hauser under the mark, 'MICROPILOT'. The frequencies used by known microwaves fill-level measuring devices lie, for example, at 6 GHz, 26 GHz or 76 GHz. FIG. 1 shows schematically an apparatus for determining fill level in a container. A description of FIG. 1 is presented in the description of the figures.

An essential component of a microwave fill-level measuring device is the high frequency module. The high frequency module includes a high frequency oscillator, which produces the microwave measuring signals, and a transmitting/receiving separator, which controls the transmitting of the microwave measuring signals, respectively the receiving of the reflected microwave measuring signals.

A known method for producing high-frequency measurement signals proposes to supply a high frequency oscillator with a pulsed supply voltage. An oscillator suitable for application in fill level measuring technology has preferably a relatively low quality factor and a high output power. The low quality factor is necessary, in order within a very short time span to pass as rapidly as possible through transient behavior to reach maximum amplitude and to have a clean decay of the oscillator. The quality factor of an oscillator refers, in such case, to the rise or decay time of an oscillator as a multiple of the period of the oscillation. A relatively high output power is necessary, in order to assure reliable fill-level measurements over a range of at least 30 m.

The circuit arrangement of an oscillator is composed essentially of an active component, which produces an oscillation, and a circuit embodied for feedback, via which the desired oscillatory behavior is tuned. Known oscillators work both in the region of low as well as also in the region of high frequencies preferably according to the Colpitts, Hartley or Clapp principles. If, in the case of an oscillator with tunable frequency, a field effect transistor is used as active component, then, in the case of known circuit arrangements, the oscillation frequency and the tunable range are essentially determined by the circuitry of the gate of the field effect transistor. In such case, the variable component, which is, for example, an adjustable capacitance, is placed in the gate circuit. Usually, the adjustable capacitance is a capacitance diode, or varactor. The circuit arrangement of a Clapp oscillator is shown in FIG. 2. A description of the circuit diagram is provided in the description of the figures.

SUMMARY OF THE INVENTION

The known oscillator principles are very well suited for obtaining a broad tuning range in the region of low frequencies. Low frequencies means here especially the frequency range below one GHz. Parasitic effects of the components, especially additional capacitances and inductances, lead, however, in the case of frequencies, which lie above, respectively far above, one GHz, to a tuning range, which becomes ever smaller, as frequency increases. The tuning range refers here to the range, over which the frequency can be tuned. In order to compare the tuning ranges of oscillators in various frequency regions, the relative tuning range is compared. This results from the ratio of the (absolute) tuning range and the center frequency, wherein the center frequency lies in the middle between the lower and upper limit frequencies. The absolute tuning range is the difference between the upper and lower maximum tunable limit frequencies. The tuning range is a continuous, uninterrupted frequency range.

With the known frequency tunable oscillators with capacitance diodes, theoretically tuning ranges of up to 10% of the center frequency, respectively the resonant frequency, can be achieved. However, a tuning range of more than 5% is technically very complex to implement. Additionally, also other disadvantages occur. An essential disadvantage is a lessening of the output power over the total tuning range.

If a high frequency oscillator is applied in a fill-level measuring device, then usually a relatively low voltage is available. Only then can the fill-level measuring device be used in an explosion-endangered area. Because of this boundary condition, the usable capacitance range of the capacitance diode is further limited. The result of this is a further limited, usable tuning range of the capacitance diode.

An object of the invention is to provide a fill-level measuring device, which is distinguished by a high frequency oscillator with a relatively large, usable tuning range.

The object is achieved by features including that the high frequency oscillator has a transistor with a source branch, a drain branch and a gate branch, at least one frequency tuning component and at least one frequency determining component, wherein the frequency determining component of the high frequency oscillator is arranged in the source branch of the transistor.

An advantageous embodiment of the apparatus of the invention provides that the high frequency module is so designed that it produces broadband, high frequency pulses. Alternatively, it is provided that the high frequency module is so designed that it produces FMCW signals, respectively frequency modulated, continuous wave signals.

Preferably, the transistor is a field effect transistor or a bipolar transistor.

An advantageous further development of the apparatus of the invention provides that the frequency tuning component is arranged in the gate branch. Preferably, the frequency tuning component is an inductor, which interacts with a parasitic capacitance of the transistor.

As already stated, the frequency determining component is arranged according to the invention in the source branch of the transistor. Preferably, the frequency determining component is a capacitive voltage divider. The capacitive voltage divider is composed in advantageous manner of a parasitic capacitance present in the transistor or of a first capacitor arranged outside of the transistor and a series circuit, which is composed of a second capacitor and a third capacitor. Seen as favorable is when a varactor diode is applied as the third capacitor.

Moreover, an advantageous form of embodiment of the measuring apparatus of the invention provides that, parallel to the series circuit of second and third capacitors, especially parallel to the varactor diode, a resistor is connected, via which the working point of the transistor is adjustable.

In a simple and cost effective embodiment, the high frequency oscillator is embodied with microstrip line technology. This embodiment is distinguished by its easy manufacturability.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWINGS

Figure 1:
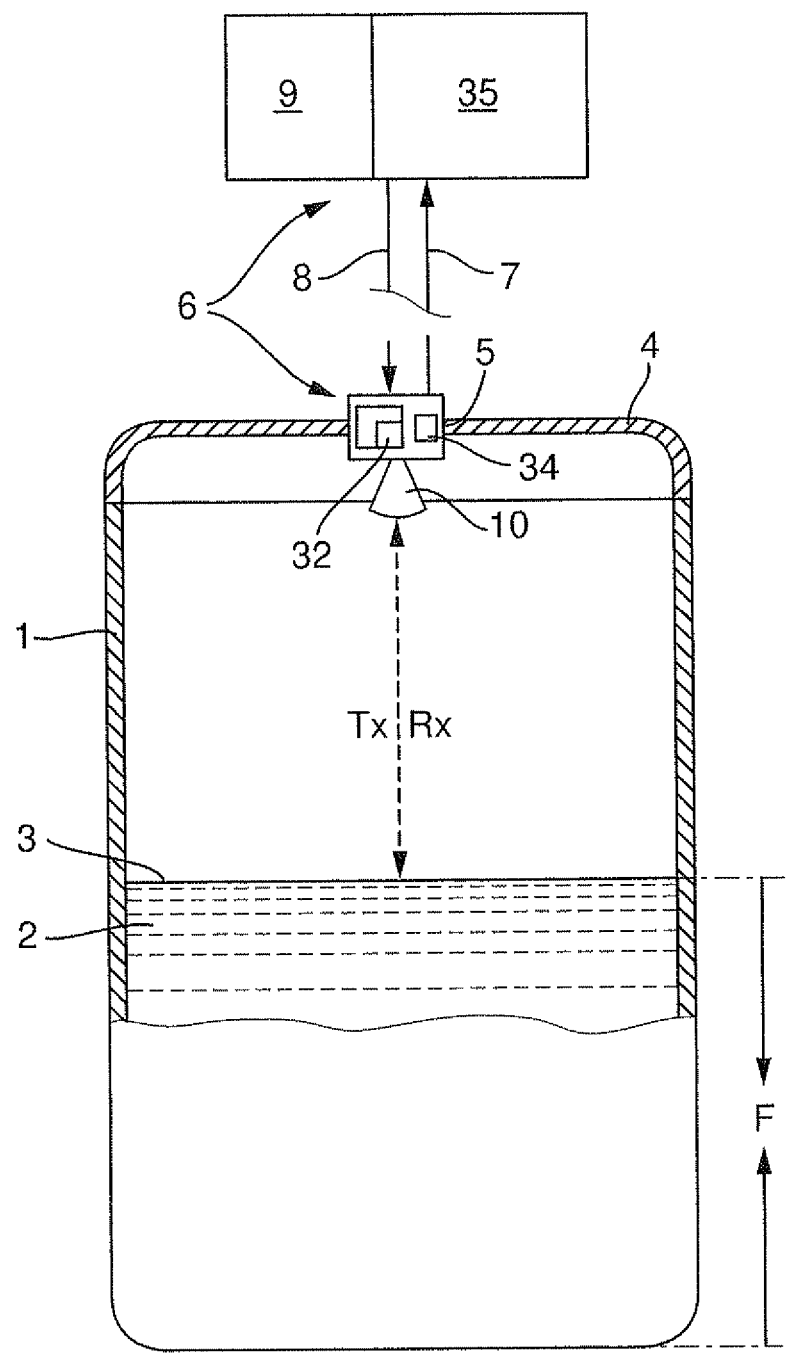
FIG. 1 is a schematic representation of an apparatus of the invention for determining the fill level of a substance in a container.

FIG. 1 shows a schematic representation of a fill-level measuring device 6, in which the high frequency oscillator 32 of the invention is preferably used. Accommodated in the container 1 is the fill substance 2. The fill level of the fill substance 2 in the container 1 is ascertained by means of the fill-level measuring device 6 via a travel-time difference method. In the illustrated case, the antenna unit 10 with signal production, transmitting and receiving unit is spatially separated from the control/evaluation unit 9. Data exchange and electrical current supply between the high frequency module producing the signals—not separately drawn in FIG. 1—and the sensor electronics 9 occurs via the connecting lines 7, 8. Of course, also a compact device can be applied as fill-level measuring device 6 in connection with the present invention.

Antenna unit 10 is mounted in the opening 5 in the lid 4 of the container 1. Radiated via the antenna unit 10 in the direction of the surface normal of the fill substance 2 are measuring signals, i.e. transmission signals, Tx, especially in the form of microwaves. The reflected echo signals Rx are then received back in the antenna unit 10. Based on the travel-time difference of the measuring signals Tx/echo signals Rx, the control/evaluation unit 9 ascertains, among other things, the current fill level of the fill substance 2 in the container 1.

Figure 2:
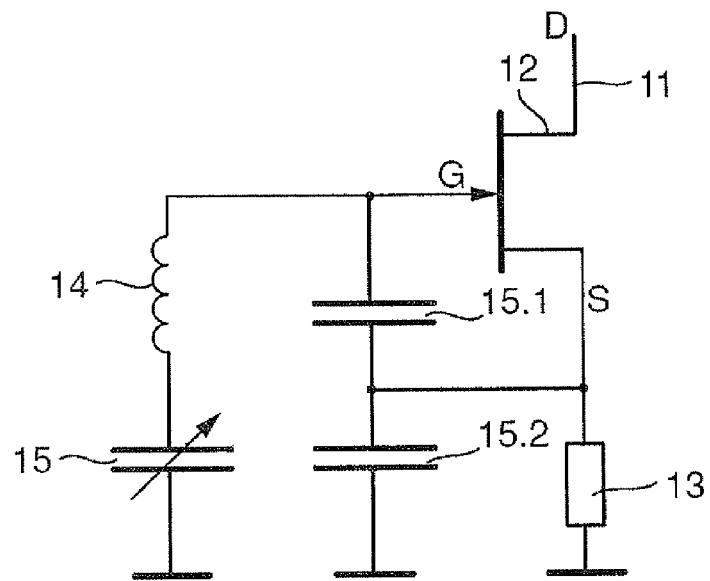
FIG. 2 is a circuit diagram of a Clapp oscillator of the state of the art.

FIG. 2 shows the circuit arrangement of a Clapp oscillator known from the state of the art. Occurring via the connection of the Clapp oscillator are both the electrical current supply as well as also the tapping of the produced oscillation signal. The Clapp oscillator is composed essentially of an active component, here a field effect transistor 12, and a feedback circuit. The feedback brings about the desired oscillatory behavior of the oscillator.

In the case of the Clapp oscillator, the frequency and the tuning range are set essentially via the circuitry of the gate branch G of the field effect transistor 12. The frequency determining oscillatory circuit is composed of the inductor 14 and the three capacitors 15, 15.1, 15.2. The two capacitors 15.1, 15.2 form a voltage divider, where a part of the oscillatory circuit voltage is fed back to the source. The output power of the oscillator can be decisively determined via the dimensioning of the voltage divider.

Used for the frequency tuning component is an adjustable capacitance 15. The adjustable capacitance 15 is usually a capacitance diode. The resistor 13 sets the working point of the field effect transistor 12. Due to high tolerances, oscillator principles applying only one capacitance diode are preferred for adjustable high frequency oscillators. As a form of reflection resonator, the circuitry of the gate branch G decisively determines the output frequency of the high frequency oscillator, so that the capacitance diode 15 is inserted into the circuitry of the gate branch G.

Figure 3:
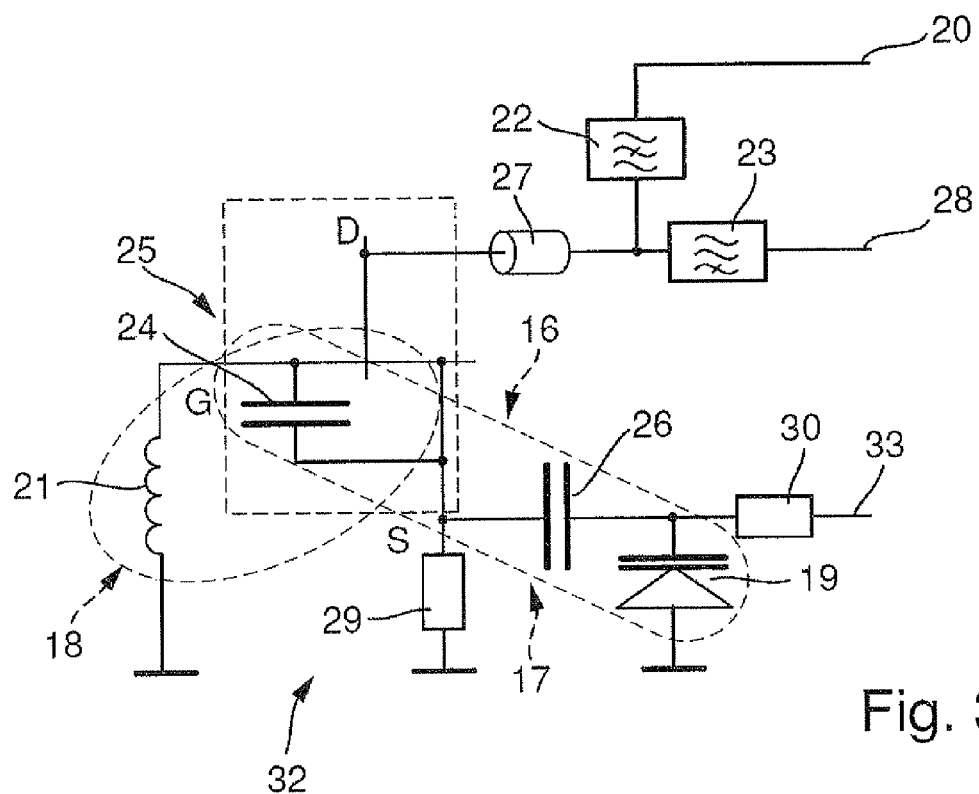
FIG. 3 is a circuit diagram of an advantageous embodiment of the high frequency oscillator of the invention.

FIG. 3 shows a circuit diagram of an advantageous embodiment of the high frequency oscillator 32 of the invention. Preferably, the high frequency oscillator 32 is applied in the fill-level measuring device 6 illustrated in FIG. 1. However, it is also possible to use the high frequency oscillator of the invention e.g. in connection with a communication device.

According to the invention, the high frequency oscillator includes, as active component, a transistor 25 having a source branch S, a drain branch D and a gate branch G, a frequency tuning component 18 and a frequency determining component 17. In contrast to the known state of the art, the frequency determining component 17 of the high frequency oscillator 32 is not in the gate branch G, but, instead, in the source branch S of the transistor 25. In the case of the circuit shown in FIG. 3, applied as transistor 25 is a field effect transistor. Of course, the transistor 25 can also be a bipolar transistor. The individual branches would then be, correctly stated, a base branch, an emitter branch and a collector branch.

The voltage controlled, high frequency oscillator 32 of the invention is so designed that it produces broadband, high frequency pulses. Alternatively, the high frequency oscillator is so designed that it produces FMCW signals, respectively frequency modulated, continuous wave signals. This is possible without problem, since a pulseable high frequency oscillator is nothing other than a special case of a continuous wave, high frequency oscillator. Likewise, the high frequency oscillator 32 can also produce so-called chirp signals.

Provided in the drain branch (D) is a line 27 with defined travel time. Adjoining this line 27 are two filter 22, 23, wherein the filter 22 is embodied as a lowpass or band blocking filter, while the filter 23 involves a bandpass filter or a highpass. The lowpass 22, respectively the band blocking filter 22, suppresses signal components of the high-frequency output signal on the connection 20 for the voltage supply. Thus, it is assured that, in the case of operating the high frequency oscillator 32 as a pulse oscillator, all signal components of the high frequency pulses are passed through to the connection 28. Connected before the high frequency output 28 is the bandpass filter 23, respectively the highpass 23. The bandpass filter 23, respectively the highpass 23, provides an insurmountable barrier for the frequency fractions of the voltage supply 20, including the direct voltage fractions, during ongoing operation.

While the frequency determining component 17 is arranged in the source branch S, the frequency tuning component 18 is arranged in the gate branch G. The frequency tuning component 18 is in the illustrated case an inductor 21, which interacts with the parasitic capacitance 24 of the transistor 12. This construction is, thus, very simple. Moreover, the gate circuit of the invention has a clearly smaller influence on the output frequency than is the case for the solutions known from the state of the art.

The frequency determining component 17 involves a capacitive voltage divider 16, which is preferably composed of a parasitic capacitance 24 present in the transistor 25 and a series circuit, composed of the second capacitor 26 and the third capacitor 19. The third capacitor 19 is preferably a varactor diode. As a function of the transistor type, the parasitic capacitance 24 can also be arranged outside of the transistor 25. In the case of the embodiment shown in FIG. 3, the parasitic capacitance 24 represents, moreover, the largest of all the parasitic capacitances of the transistor 25 and of the transistor housing.

The capacitive voltage divider 16 determines decisively the output frequency and the tuning range of the high frequency oscillator 32. The capacitance 26 serves additionally for isolating the control voltage of the capacitance-, respectively varactor, diode 19 from the setting of the working point of the transistor 25 by the resistor 29.

The resistor 30, which is connected to the input 33 of the control signal (voltage for adjusting the frequency), has a significantly greater value than the wave resistance for the high frequency signals. Therefore, resistor 30 acts for the high frequency signals approximately as isolator. In contrast, there arises for the low frequency tuning voltage, due to the high internal resistance of the capacitance diode 19 in the blocking direction, only a very smaller voltage drop across the resistor 30.

In the case of known voltage controlled, high frequency oscillators with only a capacitance diode, the output frequency increases with rising control voltage. Seen as advantageous in connection with the solution of the invention is that, in the case of correspondingly adapted dimensioning of the components, an increasing frequency decrease can be achieved with increasing control voltage.

Since the capacitance diode 19 is arranged in the source circuit, there is a slight dependence between the output frequency and the output power. This dependence can be compensated by an adapted filter 23 or by a supplemental filter (not shown).

A tuning range of more than 10% of the center frequency can be achieved with the oscillator principle illustrated in FIG. 3.

Figure 4:
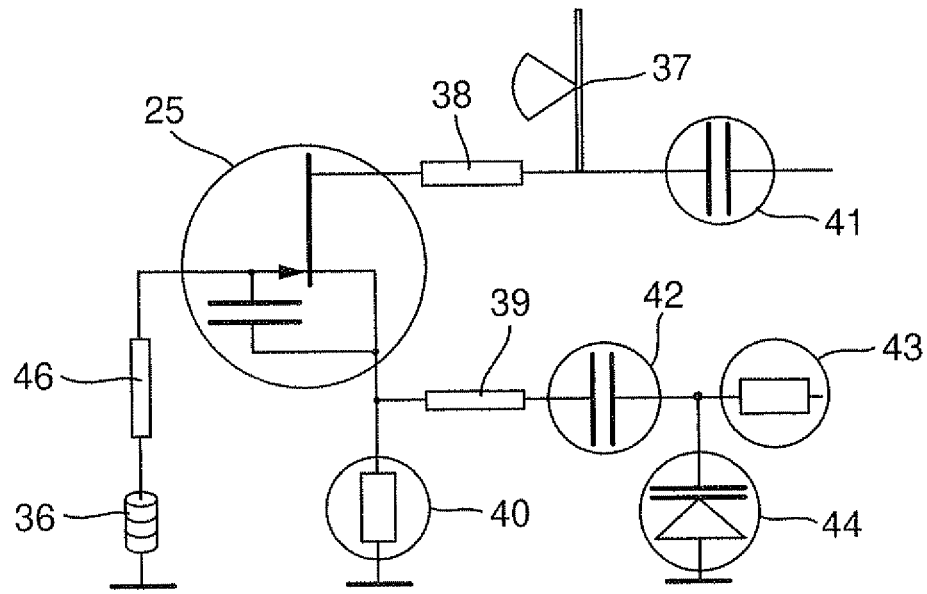
FIG. 4 is an illustration of the high frequency oscillator of FIG. 3, built in microstrip line technology with discrete components
Figure 5:
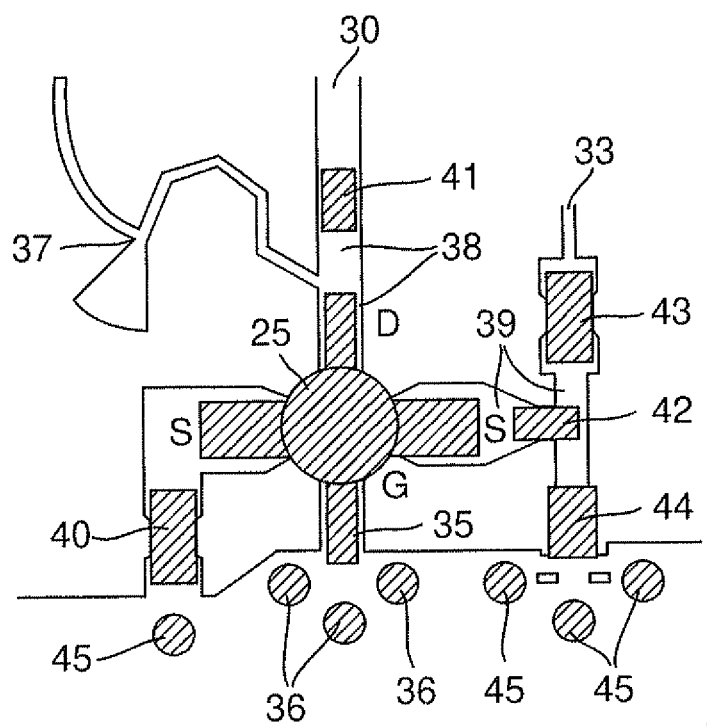
FIG. 5 is an alternative presentation of the construction shown in FIG. 4 of the high frequency oscillator in microstrip line technology with discrete components.

FIGS. 4 and 5 show options for building the high frequency oscillator of FIG. 3 using microstrip line technology and discrete components. The band blocking filter 22 of FIG. 3 is implemented in the C-band by a high-ohmic microstrip line with a radial stub 37, the bandpass filter by a discrete capacitor and the line with defined travel time 27 by a piece of microstrip line 38. The field effect transistor 25 providing a part of the capacitive voltage divider, the varactor diode 44, the capacitor 42 and the resistances 40, 43 are provided as discrete components. The inductance of the gate circuit of the transistor 25 is implemented by the microstrip line 46 and three vias 36. For technical reasons, there arises an additional travel time 39 between the transistor 25 and the varactor diode 44. This limits the tuning range of the varactor diode 44, however, only slightly. Other vias 45, which connect the components 40, 44 with the grounding area beneath the circuit board, are illustrated as circles.

The invention claimed is:

1. An apparatus for determining or monitoring the fill level of a substance in a container, comprising:
    a high frequency oscillator producing high-frequency measuring signals;
    an in/out coupling unit, an antenna, which transmits the high-frequency measuring signals in the direction of the surface of the fill substance and receives the measuring signals reflected on the surface of the fill substance; and
    an evaluation unit, which, based on the travel-time difference of the transmitted measuring signals and the reflected measuring signals, ascertains the fill level in the container, wherein:
    said high frequency oscillator has a transistor with a source branch, a drain branch and a gate branch, at least one frequency tuning component and at least one frequency determining component; and
    said frequency determining component of said high frequency oscillator is arranged in the source branch of said transistor.

2. The apparatus as claimed in claim 1, wherein:
    said high frequency module is so designed that it produces broadband high frequency pulses.

3. The apparatus as claimed in claim 1, wherein:
    said high frequency module is so designed that it produces FMCW signals, respectively frequency modulated, continuous wave signals.

4. The apparatus as claimed in claim 1, wherein:
    said transistor is a field effect transistor or a bipolar transistor.

5. The apparatus as claimed in claim 1, wherein:
    said frequency tuning component is arranged in said gate branch.

6. The apparatus as claimed in claim 5, wherein:
    said frequency tuning component is an inductor, which interacts with a parasitic capacitance of said transistor.

7. The apparatus as claimed in claim 1, wherein:
    said frequency determining component is a capacitive voltage divider, which is preferably composed of a parasitic capacitance present in said transistor and/or of a first capacitor arranged outside of said transistor and a series circuit composed of a second capacitor and a third capacitor.

8. The apparatus as claimed in claim 7, wherein:
said third capacitor is a varactor diode.

9. The apparatus as claimed in claim 7, wherein:
parallel to the series circuit of said second capacitor and said third capacitor, especially parallel to said varactor diode, a resistor is connected, via which the working point of said transistor is adjustable.

10. The apparatus as claimed in claim 1, wherein:
the high frequency oscillator is embodied with microstrip line technology.

\* \* \* \* \*